United States Patent
Ngan

[11] Patent Number: 6,071,811
[45] Date of Patent: Jun. 6, 2000

[54] DEPOSITION OF TITANIUM NITRIDE FILMS HAVING IMPROVED UNIFORMITY

[75] Inventor: Kenny King-Tai Ngan, Fremont, Calif.

[73] Assignee: Applied Materials, Inc., Santa Clara, Calif.

[21] Appl. No.: 08/806,966

[22] Filed: Feb. 26, 1997

[51] Int. Cl.[7] .................................................. H01L 21/4763
[52] U.S. Cl. ....................... 438/648; 438/656; 438/683; 438/685
[58] Field of Search ...................... 437/192, 195; 438/653, 655, 656, 664, 660, 685, 688, 648, 683

[56] References Cited

U.S. PATENT DOCUMENTS

| | | | |
|---|---|---|---|
| 4,361,114 | 11/1982 | Gurev | 118/723 |
| 5,449,641 | 9/1995 | Maeda | 437/195 |
| 5,492,606 | 2/1996 | Stauder et al. | 204/192.12 |
| 5,591,672 | 1/1997 | Lee et al. | 437/190 |
| 5,597,745 | 1/1997 | Byun et al. | 437/41 |
| 5,604,140 | 2/1997 | Byun | 437/41 |
| 5,618,388 | 4/1997 | Seeser et al. | 204/192.12 |
| 5,801,098 | 9/1998 | Fiordalice et al. | 438/653 |

*Primary Examiner*—David Nelms
*Assistant Examiner*—Renee' R. Berry
*Attorney, Agent, or Firm*—Birgit E. Morris

[57] ABSTRACT

I have found that in order to improve sheet resistance uniformity of metal nitride films, such as titanium nitride, the chamber must be operated at low pressure. The nitrogen gas flow rates required to deposit metal nitride is determined, and the pumping speed in the chamber is increased to produce uniform films at low pressure.

5 Claims, 3 Drawing Sheets

DEPOSITION OF TITANIUM NITRIDE FILMS HAVING IMPROVED UNIFORMITY

This invention relates to sputter deposition of metal nitride having improved sheet resistance uniformity. More particularly, this invention relates to depositing metal nitride films at low pressure.

BACKGROUND OF THE INVENTION

Metal nitrides, such as TiN, are used as barrier layers between aluminum lines and contacts on a semiconductor substrate, such as silicon, and the underlying substrate. Without a barrier layer, at elevated temperatures of about 450° C. and higher, the aluminum reacts with silicon, forming a silicide. This conductive silicide provides a conductive path between the aluminum and the substrate, which can destroy underlying devices.

TiN is generally deposited by sputtering in a physical vapor deposition chamber in the presence of nitrogen gas. FIG. 1 illustrates a conventional sputtering chamber. A target 12, of Ti or other metal, is mounted in a low pressure chamber opposite and parallel to a substrate support 14. The target 12 has a pair of magnets 16 and 18 mounted behind it. A source of power 13 is attached to the target 12 and an inert, generally noble gas, such as argon, is fed to the chamber through an inlet 19. The argon gas molecules are attracted by the magnet pair 16, 18, so that they bombard the target 12, sputtering particles of target material, which particles deposit on the substrate support 14 and a substrate 22 mounted thereon. In the case of a Ti target, nitrogen gas can also be added to the chamber via the inlet 19. The Ti reacts with the nitrogen, forming TiN.

However, the bottom coverage of the TiN in high aspect ratio vias/contacts is very low.

Thus, in an attempt to improve the bottom coverage of sputtered particles, a high density, inductively coupled RF plasma region is formed between the target and the substrate. Sputtered particles from the target then become ionized as they pass through the plasma region, and more of the sputtered particles impact the substrate support electrode in a perpendicular direction. The negative bias on the support electrode attracts the positively charged metal ions, with the L5 result that more of the sputtered particles deposit at the bottom of the via/contact, significantly enhancing the bottom coverage.

FIG. 2 is a schematic cross sectional view of an inductively coupled modified plasma sputtering chamber useful in the present invention.

The present chamber, designated as an "ionized metal plasma or "IMP" chamber 170, includes a conventional target 172 mounted on a top wall 173 of the chamber 170. A pair of opposing magnets 176, 178, are mounted over the top of the chamber 173. A substrate support 174 bearing a substrate 175 thereon, is mounted opposite to the target 172. A source of power 180 is connected to the target 172 and a source of RF power 182 is connected to the substrate support 174. A controller 200 regulates gas flows. A helical coil 186 is mounted inside the chamber 170 and connected to a source of RF power 188. Nitrogen and argon in vessels 192, 194 are metered to the chamber by means of flow valves 196, 198 respectively.

The pressure in the chamber is maintained by a cryogenic pump 190 through an inlet 191 via a three position gate valve 199. Providing that the pressure in the chamber is fairly high, i.e., about 30 millitorr, the internal inductively coupled coil 186 provides a high density plasma in the region between the sputtering cathode or target 172 and the substrate support 174. Thus metal ions such as Ti that pass through the high density plasma region become ionized, and in the presence of ionized nitrogen gas, form a stoichiometric "deep nitrided" TiN.

Typically, in accordance with the prior art, the chamber pressure increases as the nitrogen gas flow rates are increased to about 30–40 millitorr during sputtering. This level of chamber pressure is achieved using the cryogenic pump 190 and a restrictor, such as a three-position gate valve 199. If the gate valve remains fully open, the pressure in the chamber is low, i.e., less than about 10 millitorr. However, at such low pressure sufficient metal ionization will not take place. Thus in order to obtain a higher pressure in the chamber, i.e., about 30–40 millitorr, the gate valve is used to decrease the pumping speed and increase the pressure, required for adequate ionization of the metal particles in the chamber.

FIG. 3 is a prior art TiN hysteresis plot of pressure versus nitrogen gas flow in sccm obtained at an argon flow of 25 sccm. It is apparent that a nitrogen gas flow of 55 sccm or higher is required to ensure that sputtering occurs in the "deep nitrided" mode; which refers to the crystalline orientation of the TiN film. Referring to FIG. 3, 5 kW of DC power was applied to the target and 2.5 kW of RF power was connected to the substrate support at a substrate temperature of 200° C. The upper line 2, indicating formation of TiN, requires a flow rate of nitrogen of over 50 sccm. However, at such high nitrogen flow rates, the pressure in the chamber is 38 millitorr or higher, which creates scattering of gases in the chamber. The resultant TiN films are non-uniform as measured by sheet resistance uniformity. FIG. 4 is a contour plot of sheet resistance of the TiN film deposited. The uniformity is quite poor, about 18%, 1 sigma.

Thus a method of improving deposition uniformity of TiN films deposited in an IMP chamber to obtain improved sheet resistance uniformity, has been sought.

SUMMARY OF THE INVENTION

I have found that by increasing the pumping speed in a sputtering chamber, and by determining, for a given chamber pressure, the gas flow rate of nitrogen required to deposit TiN, and maintaining that pressure in the chamber by increasing the pumping speed, TiN having improved sheet resistance uniformity can be obtained. The pressure in the chamber can be reduced even at high gas flow rates.

DETAILED DESCRIPTION OF THE INVENTION

In order to improve the sheet resistance uniformity of sputtered nitrided metal films in a plasma sputtering chamber, the chamber must be operated at low pressure. The gas flow rates of nitrogen required at that pressure to produce a stoichiometric metal nitride film is determined and the pumping speed of the exhaust pump is increased to produce uniform films at low pressure.

Figure 3:
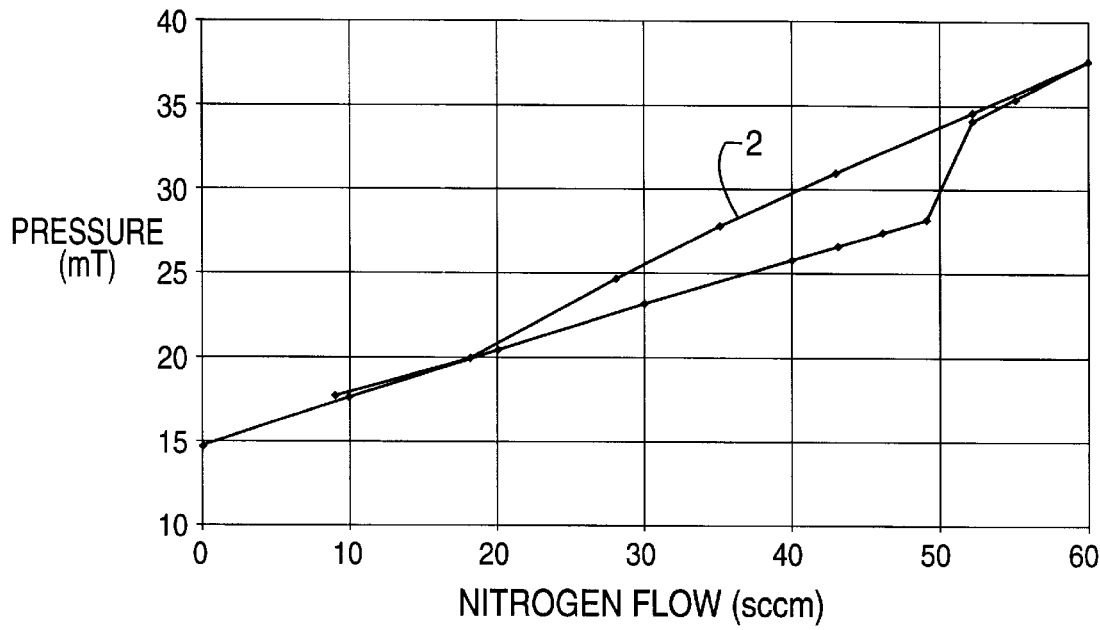
FIG. 3 is a hysteresis curve obtained using a prior art process for sputter depositing TiN at a pressure of 38 millitorr.
Figure 4:
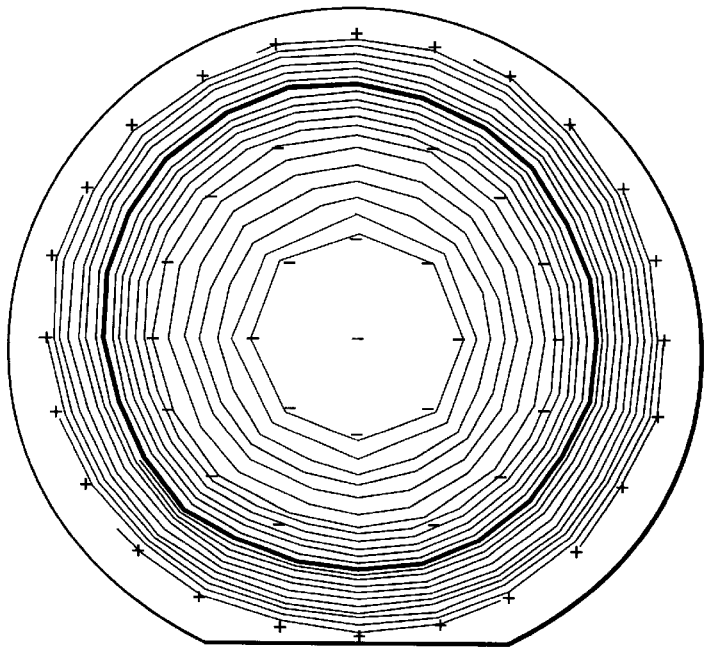
FIG. 4 is a contour plot of sheet resistance of TiN deposited on a substrate in accordance with the prior art.

Referring to FIG. 3, in order to ensure that stoichiometric TiN is formed, a nitrogen flow of at least 55 sccm or higher is required to provide a sufficient nitrogen density to form TiN. If the pressure in the chamber is too low, or the nitrogen flow is too low, the Ti will not completely react with nitrogen.

Figure 1:
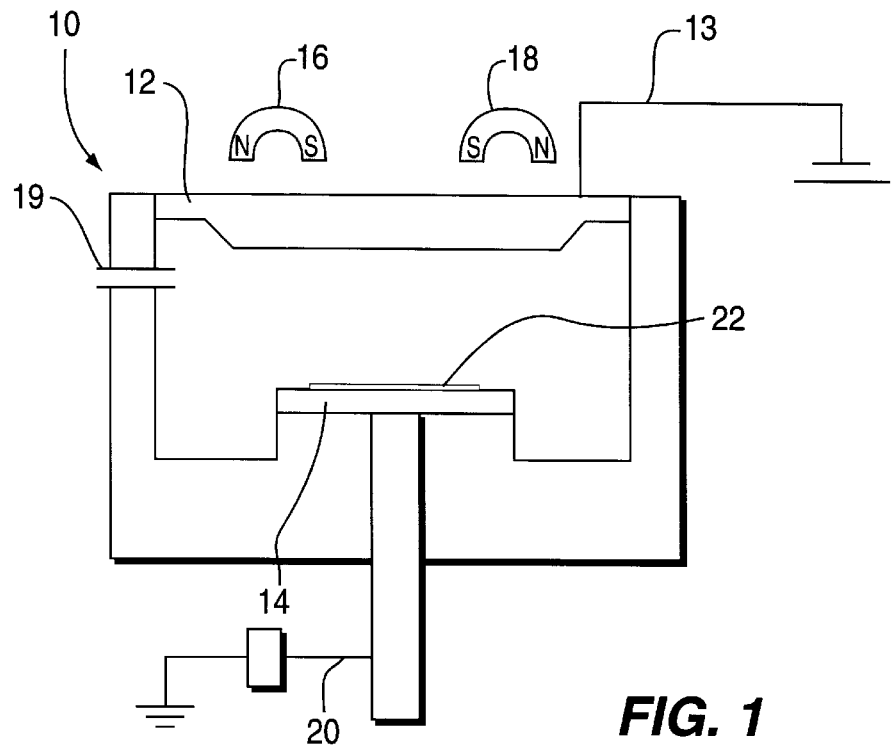
FIG. 1 is a schematic cross sectional view of a conventional sputtering chamber.
Figure 2:
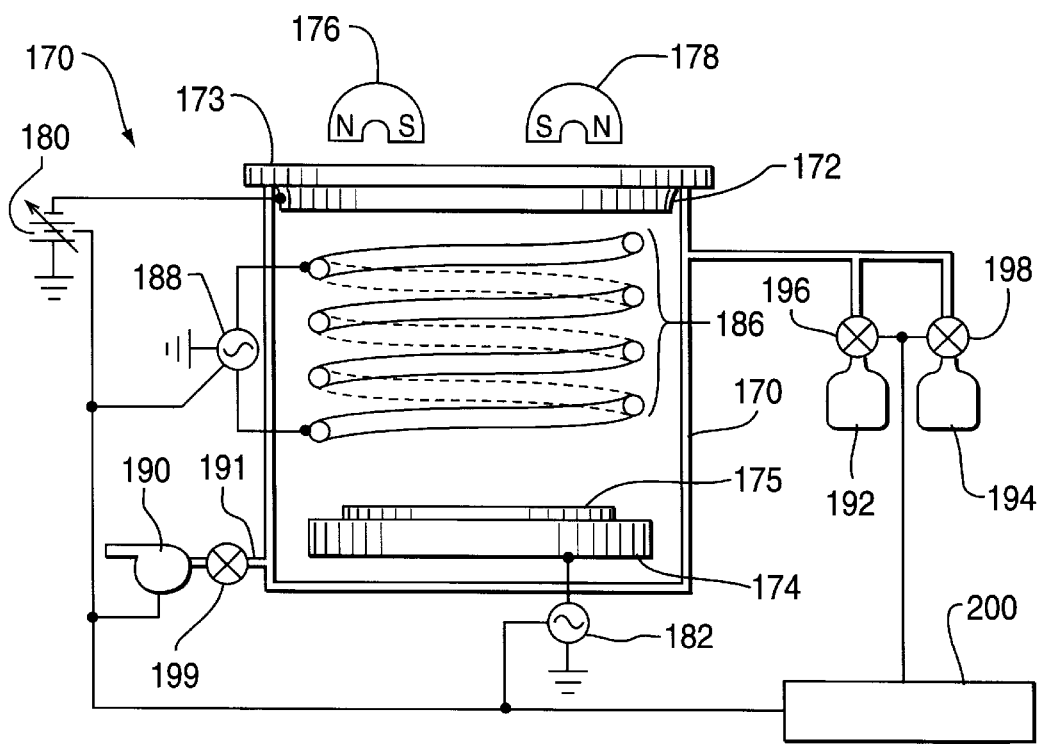
FIG. 2 is a schematic cross sectional view of a modified sputtering chamber that produces a plasma in the chamber.

If a barrier layer containing sequential layers of Ti and TiN is desired, the Ti which can be deposited before and/or after deposition of TiN, the chamber 170 of FIG. 2 provides a ready means of changing the deposition by changing the nitrogen gas flow rate and the pressure. The gas flow rates are adjusted by means of valves 196 and 198, or by opening or closing the gate valve 199.

Figure 5:
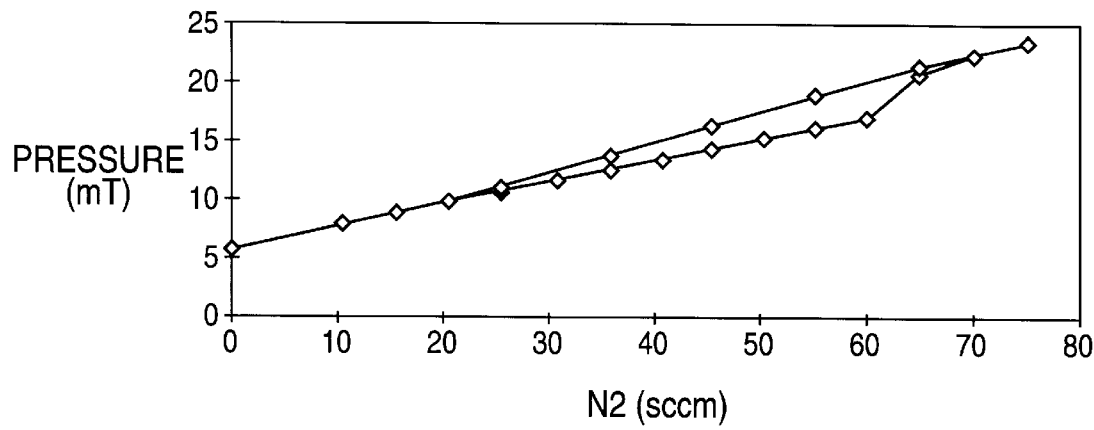
FIG. 5 is a hysteresis curve obtained using the process of the invention for sputter depositing TiN at low pressure.
Figure 6:
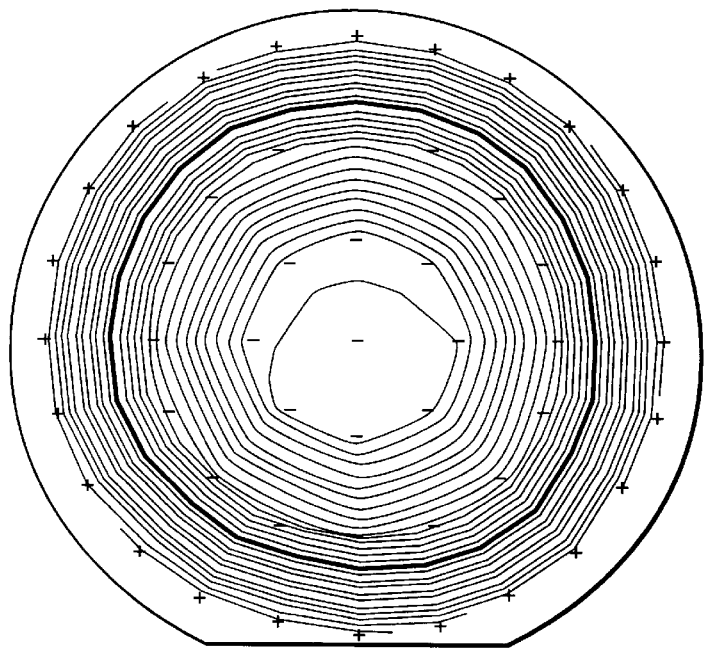
FIG. 6 is a contour plot of sheet resistance of TiN deposited in accordance with the invention.

FIG. 5 is a hysteresis plot of TiN formation showing an initial pressure of 5 millitorr, using 5 killiwatts of DC power and 2.5 killiwatts of RF power to the coil, and an argon flow of 15 sccm. In order to obtain stoichiometric TiN, the nitrogen flow rate must be at or greater than about 65–70 sccm. However, by adjusting the position of the gate valve 199 to reduce the pressure by increasing the pumping speed of the exhaust pump 190, the pressure remains low at 22 millitorr and the sheet resistance uniformity of the TiN film deposited using the above conditions, is improved. FIG. 6 is a contour plot of sheet resistance of TiN deposited at 22 millitorr, wherein the uniformity was improved to 10%, 1 sigma.

Instead of a three position gate valve, a restrictor in the exhaust line can be used to increase the pumping speed in the chamber to keep the chamber pressure low. The reduced chamber pressure reduces gas scattering over that using a higher pressure, and the film sheet resistance uniformity is improved.

An additional advantage is obtained when the helical coil 186 is made of the same material as the target 172. If any of the coil material is sputtered during processing, or reacts with ionized nitrogen in the plasma region, no contamination of the TiN layer, or any Ti layer deposited, occurs. In the case of a Ti target and a Ti coil, all of the reacted or deposited material will be Ti or TiN.

The present process can be used to sputter materials other than TiN, such as TiWN or TaN, by substituting an appropriate target. A hysteresis plot can be used to determine the gas flow rates of the reactant gases required for complete nitration, and the pumping speed is adjusted to maintain a low pressure in the chamber.

The present process of adjusting gas flow rates and pressure can also be used for conventional sputtering chambers that do not employ a high density plasma in the chamber.

Although the present invention has been described in terms of particular embodiments, the invention is not meant to be limited except by the scope of the appended claims.

I claim:

1. A method of depositing stoichiometric metal nitride films in a sputtering chamber at a given pressure in the chamber of up to about 40 millitorr which comprises passing nitrogen gas into the chamber at a sufficient gas flow rate so as to obtain stoichiometric metal nitride films and regulating the exhaust pumping speed in the chamber so as to maintain the desired pressure.

2. A method according to claim 1 wherein the sputtering chamber has an internal inductively coupled coil that produces a plasma between the sputtering target and the substrate.

3. A method according to claim 1 wherein the pressure in the chamber is below about 30 millitorr.

4. A method according to claim 1 wherein the pressure in the chamber is below about 22 millitorr.

5. A method according to claim 1 wherein the metal is titanium.

* * * * *